(12) United States Patent
Kuroda et al.

(10) Patent No.: US 9,293,620 B2
(45) Date of Patent: Mar. 22, 2016

(54) SPACE MACHINE

(75) Inventors: Yoshikatsu Kuroda, Tokyo (JP);
Hiroshi Ikebuchi, Tokyo (JP); Kazunori Masukawa, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 14/008,018

(22) PCT Filed: Feb. 24, 2012

(86) PCT No.: PCT/JP2012/054628
§ 371 (c)(1),
(2), (4) Date: Sep. 27, 2013

(87) PCT Pub. No.: WO2012/132690
PCT Pub. Date: Oct. 4, 2012

(65) Prior Publication Data
US 2014/0007920 A1     Jan. 9, 2014

(30) Foreign Application Priority Data
Mar. 29, 2011 (JP) ................................. 2011-073366

(51) Int. Cl.
*H01L 31/054* (2014.01)
*H01L 31/052* (2014.01)
*H02S 20/30* (2014.01)
*B64G 1/44* (2006.01)

(52) U.S. Cl.
CPC .............. *H01L 31/0524* (2013.01); *B64G 1/44* (2013.01); *H01L 31/0543* (2014.12); *H01L 31/0547* (2014.12); *H02S 20/30* (2014.12); *Y02E 10/52* (2013.01)

(58) Field of Classification Search
USPC .................................. 136/251, 252, 259, 292
See application file for complete search history.

(56) References Cited

U.S. PATENT DOCUMENTS

| | | | |
|---|---|---|---|
| 3,379,394 A * | 4/1968 | Bialy | 244/172.8 |
| 3,948,468 A | 4/1976 | Anchutin | |
| 4,354,348 A | 10/1982 | Lee | |
| 4,462,391 A | 7/1984 | Laussermair et al. | |
| 4,687,880 A | 8/1987 | Morris | |
| 6,037,535 A * | 3/2000 | Yoshino | 136/246 |
| 6,343,464 B1 | 2/2002 | Westerman et al. | |

(Continued)

FOREIGN PATENT DOCUMENTS

| | | |
|---|---|---|
| EP | 1 156 960 | 9/2004 |
| JP | 62-134398 | 6/1987 |

(Continued)

OTHER PUBLICATIONS

JP 2004309349 A, Takahashi M. English equivalent of the abstract.*
International Preliminary Report on Patentability and Written Opinion of the International Searching Authoirty issued Oct. 2, 2013 in International(PCT) Application No. PCT/JP2012/054628.
International Search Report issued Jun. 5, 2012 in International (PCT) Application No. PCT/JP2012/054628.
Office Action issued Nov. 6, 2014 in Russian Application No. 2013143835, with partial English translation.

(Continued)

*Primary Examiner* — Susan D Leong
(74) *Attorney, Agent, or Firm* — Wenderoth, Lind & Ponack, L.L.P.

(57) ABSTRACT

A technique which can reduce a cost of a space machine installed with a solar cell. The space machine is composed of a light collecting unit and the solar cell. The light collecting unit is arranged on a surface of the body of the space machine to collect incident sun light inside the body. The solar cell is installed inside the body to receive the sun light collected by the light collecting unit.

3 Claims, 4 Drawing Sheets

(56) References Cited

U.S. PATENT DOCUMENTS

2008/0092541 A1     4/2008    Palmer
2009/0032085 A1     2/2009    Grumazescu

FOREIGN PATENT DOCUMENTS

| | | |
|---|---|---|
| JP | 63-141899 | 6/1988 |
| JP | 02-42900 | 3/1990 |
| JP | 5-77797 | 3/1993 |
| JP | 7-335004 | 12/1995 |
| JP | 9-145357 | 6/1997 |
| JP | 2002-12198 | 1/2002 |
| JP | 2003-149586 | 5/2003 |
| JP | 2004309349 A * | 11/2004 |
| RU | 2 027 316 | 1/1995 |
| RU | 2 209 161 | 7/2003 |
| WO | 2010/100137 | 9/2010 |

OTHER PUBLICATIONS

Grilihes et al., "Solar energy and space flights", "Nauka". M., 1984, pp. 188-191 (Concise explanation of relevance provided in partial English translation of Office Action issued Nov. 6, 2014 in Russian Application No. 2013143835).

Extended European Search Report issued Aug. 25, 2014 in corresponding European Application No. 12765732.8.

Decision to Grant issued Mar. 10, 2015 in corresponding Russian Application No. 2013143835, with English translation.

Office Action issued Feb. 4, 2015 in corresponding Japanese Application No. 2011-073366, with partial English language translation.

Decision to Grant a Patent issued Sep. 8, 2015 in Japanese Application No. 2011-073366, with English translation.

* cited by examiner

SPACE MACHINE

TECHNICAL FIELD

The present invention is related to a space machine installed with a solar cell system. Especially, the present invention is related to a space machine which a solar cell panel is not developed.

BACKGROUND ART

In space machines such as an artificial satellite and a spacecraft, a solar cell system is used. Such space machines are classified into ones which develop a solar cell panel and ones which do not develop a solar cell panel. In case of the space machine which does not develop the solar cell panel, the solar cell system is attached to the whole surface of the main body of the space machine (for example, disclosed in Patent Literature 1).

CITATION LIST

[Patent literature 1] JP H05-77797A

SUMMARY OF THE INVENTION

However, when the solar cell is attached to the main body surface of the space machine, the cost becomes high.

One object of the present invention is to provide a technique which can reduce the cost of a space machine installed with a solar cell system.

In one aspect of the present invention, a space machine is composed of a light collecting unit and a solar cell. The light collecting unit is arranged on the surface of a body of the space machine to collect the incident sun light inside the body. The solar cell is installed inside the body to receive the sun light collected by the light collecting unit.

The body may have a plurality of surfaces which turn to the different directions. In this case, the number of light collecting units is plural and a plurality of light collecting units are respectively arranged on the plurality of surfaces.

The solar cell which is singular may be installed inside the body.

Moreover, the space machine may be provided a drive unit configured to change the orientation of the singular solar cell and a control unit configured to control the drive unit based on the incident direction of the sun light. It is an incident light collecting unit of a plurality of light collecting units that the sun light is incident. In this case, the control unit controls the drive unit such that the singular solar cell receives the sun light from the incident light collecting unit.

For example, the body is a hexahedron and the plurality of surfaces are the surfaces of the hexahedron.

The light collecting unit may be a slit.

The cost of the space machine, installed with the solar cell, according to the present invention becomes able to be reduced.

DESCRIPTION OF EMBODIMENTS

A space machine according to embodiments of the present invention will be described with reference to the attached drawings.

First Embodiment

Figure 1:
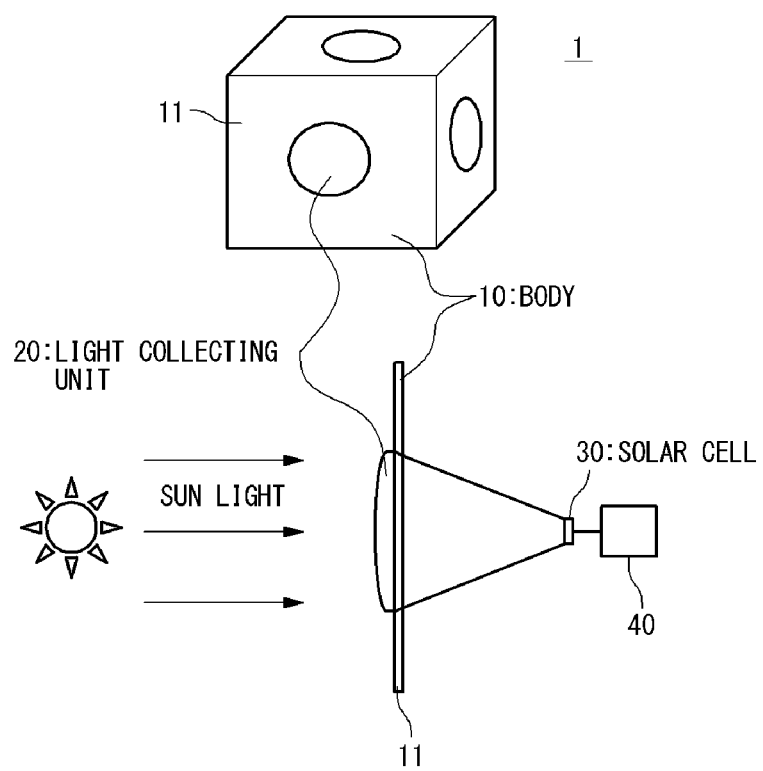
FIG. 1 is a conceptual diagram showing a space machine according to a first embodiment of the present invention.

FIG. 1 is a conceptual diagram showing a space machine 1 according to a first embodiment of the present invention. As the space machine 1, an artificial satellite and a spacecraft are exemplified.

A main body 10 of the space machine 1 has a plurality of body surfaces 11. The plurality of body surfaces 11 turn to directions which are different from each other. That is, the directions of the normal lines of plurality of body surfaces 11 are different from each other. For example, as shown in FIG. 1, the body 10 of the space machine 1 is a hexahedron. In this case, a plurality of body surfaces 11 are the surfaces of a hexahedrons.

The space machine 1 according to the present embodiment is installed with a solar cell 30. However, the space machine 1 does not have the structure in which a solar cell panel is developed. Also, the solar cell 30 is not attached on the body surfaces 11. Instead, according to the present embodiment, the solar cell 30 is installed inside the main body 10 of the space machine 1 (inside from the body surface 11).

The solar cell 30 is arranged inside the main body 10 whereas a light collecting unit 20 is arranged on the body surface 11. For example, the light collecting unit 20 is a collecting lens. When the main body 10 has the plurality of body surfaces 11 which turn to directions different from each other, as shown in FIG. 1, a plurality of light collecting units 20 are arranged on the plurality of body surfaces 11. Each light collecting unit 20 collects the sun light which is incident from the outside of the main body 10, so that the sun light is irradiated into the inside of the main body 10.

The solar cell 30 which is arranged inside the main body 10, receives the sun light which is collected by the light collecting unit 20 and generates power.

As described above, according to the present embodiment, it is not necessary to attach large-sized and expensive solar cells on all the surfaces of the main body 10 of the space machine 1. The solar cell 30 which is arranged inside the main body 10 and which receives the sun light collected by the light collecting unit 20 may be of a small size. Therefore, the cost of the space machine 1 is substantially reduced.

Moreover, because it is not necessary to attach the solar cell on the body surfaces 11 of the space machine 1, an equipment except the solar cell (e.g. an antenna and a sensor) can be arranged on the body surface 11 except the area of the light collecting unit 20. This contributes to dwarf the space machine 1.

Second Embodiment

The solar cell 30 may be provided every light collecting unit 20. That is, a plurality of solar cells 30 may be provided to oppose to the plurality of light collecting units 20 (a plurality of body surfaces 11), respectively. In this case, the plurality of solar cells 30 receive the sun light through the plurality of light collecting units 20 arranged on the plurality of body surfaces 11.

However, the sun light is not always incident at a same time through all the light collecting units 20. For example, in case of the space machine 1 of the hexahedron shown with FIG. 1, the sun light is incident only on a part of the six light collecting units 20 arranged on the six body surfaces 11. One, to which the sun light is incident, of the plurality of light collecting units 20 is hereinafter referred to as an "incident light collecting unit". Because the incident light collecting unit is a part of all the light collecting units 20, it does not always need that the solar cell 30 is provided for every light collecting unit 20. On the other hand, when the space machine 1 performs rotation movement, the incident direction of the sun light, i.e. the incident light collecting unit 20 changes with the time. Therefore, it is not necessary to provide the solar cell 30 every light collecting unit 20. In this case, however, it is necessary to make the orientation of the solar cell 30 changeable.

The second embodiment of the present invention is based on the above-mentioned knowledge. Hereinafter, the second embodiment of the present invention will be described in detail.

Figure 2:
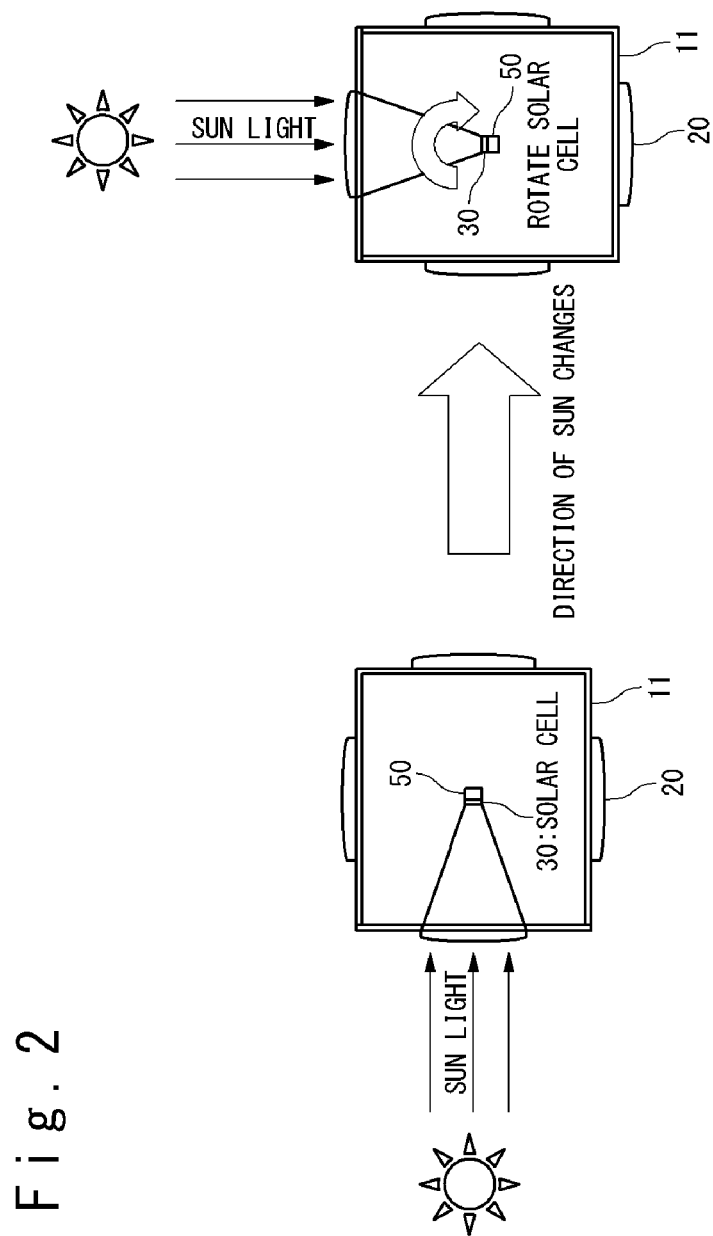
FIG. 2 is a conceptual diagram showing the space machine according to a second embodiment of the present invention.

FIG. 2 is a conceptual diagram showing the space machine 1 according to a second embodiment. In the present embodiment, a singular solar cell is installed inside the main body 10 of the space machine 1. The singular solar cell 30 receives the sun light through the incident light collecting unit 20 to which the sun light is incident most. However, when the incident direction of the sun light changes with the rotation movement of the space machine 1, the incident light collecting unit 20 to which the sun light is incident most also changes. It is necessary to change the orientation of the singular solar cell 30 (direction to the light incident surface) to the direction of the light collecting unit 20 to which the sun light is incident most, so as to follow the change. Therefore, the drive unit 50 is provided to change the orientation of the solar cell 30.

Figure 3:
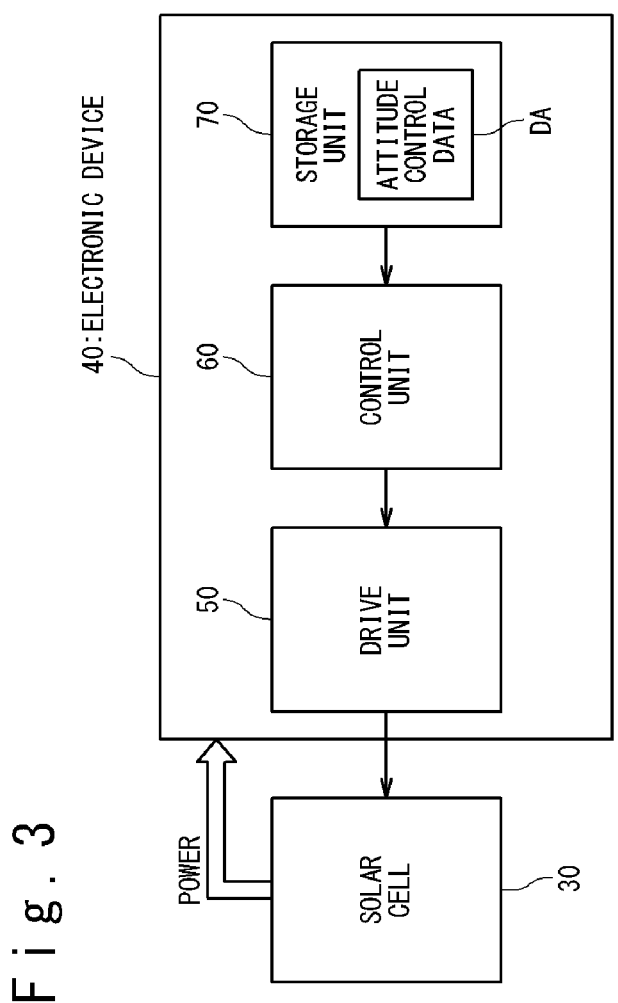
FIG. 3 is a block diagram showing a structure example of an electronic device according to a second embodiment.

As shown in FIG. 3, in more detailed, an electronic device 40 is composed of the drive unit 50, a control unit 60 and a storage unit 70. The drive unit 50 changes the orientation of the solar cell 30 (to the direction to the light incident surface) according to an instruction from the control unit 60.

The control unit 60 controls the drive unit 50 according to the incident direction of the sun light. Specifically, the control unit 60 refers to attitude control data DA stored in the storage unit 70. The attitude control data DA contain data of the direction of the sun and the posture of the space machine 1. The control unit 60 controls the drive unit 50 to refer to the attitude control data DA and the solar cell 30 to receive the sun light from the incident light collecting unit 20 to which the sun light is incident most.

As described above, according to the second embodiment, the singular solar cell 30 can handle all the light collecting units 2. Because the number of solar cells 30 can be substantially reduced, the cost of the space machine 1 can be substantially reduced.

Third Embodiment

Figure 4:
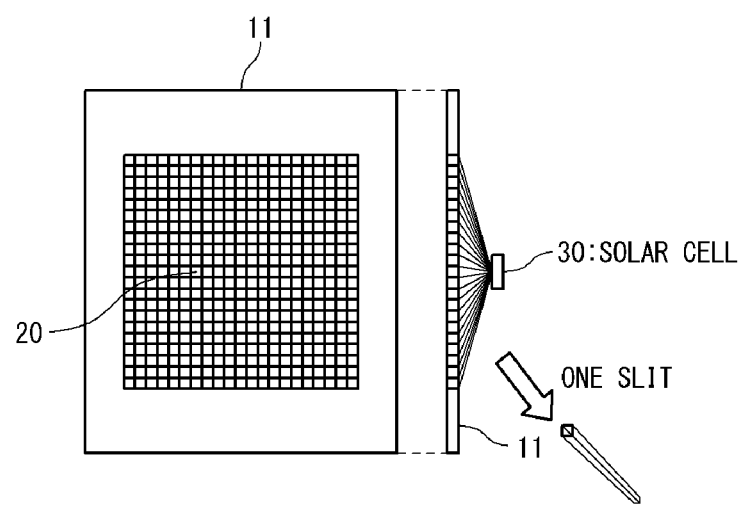
FIG. 4 is a conceptual diagram showing the space machine according to a third embodiment of the present invention.

FIG. 4 is a conceptual diagram showing the space machine 1 according to a third embodiment of the present invention. In the present embodiment, a slit is used as the light collecting unit 20. In this case, a distance from the body surface 11 to the solar cell 30 can be made short. Also, a light reception angle range can be made wide.

Also, a slit may be used as the light collecting unit 20 and moreover a honeycomb structure may be used as the slit.

The embodiments of the present invention have been described with reference to the attached drawings. However, the present invention is not limited to the above-mentioned embodiments, and can be appropriately changed by a person skilled in the art in the range which does not deviate from a range of features of the present invention.

The present application claims a priority on convention based on Japan Patent Application JP 2011-073366 filed on Mar. 29, 2011. The disclosure thereof is incorporated herein by reference.

The invention claimed is:

1. A space machine comprising:
   a main body of said space machine, said main body having a three-dimensional shape with a plurality of surfaces which turn to different directions;
   a plurality of light collecting lenses disposed on said plurality of surfaces such that each of said plurality of light collecting lenses is disposed on one of said plurality of surfaces to collect incident sun light into an inside of said main body;
   a solar cell arranged inside said main body for said plurality of light collecting lenses, said solar cell receiving the sun light collected by only a selected one of said plurality of light collecting lenses at a given time to generate electric power; and
   a driving section configured to (i) select, as said selected one of said plurality of light collecting lenses, one of said plurality of light collecting lenses based on an incident direction of the sunlight and (ii) drive said solar cell to turn to said selected one of said plurality of light collecting lenses at the given time.

2. The space machine according to claim 1,
   wherein said driving section comprises:
      a drive unit configured to drive said solar cell to change an orientation of said solar cell; and
      a control unit configured to control said drive unit based on the incident direction of the sun light, and
   wherein said control unit controls said drive unit such that said solar cell receives the sun light from said selected one of said plurality of light collecting lenses.

3. The space machine according to claim 1,
   wherein said main body is a hexahedron, and
   wherein said plurality of surfaces are the surfaces of the hexahedron.

\* \* \* \* \*